United States Patent
Shi

(10) Patent No.: US 12,334,134 B2
(45) Date of Patent: Jun. 17, 2025

(54) ADDRESS REFRESH CHECK METHOD AND APPARATUS, STORAGE MEDIUM, AND ELECTRONIC DEVICE

(71) Applicant: Changxin Memory Technologies, Inc., Anhui (CN)

(72) Inventor: Teng Shi, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 188 days.

(21) Appl. No.: 18/232,309

(22) Filed: Aug. 9, 2023

(65) Prior Publication Data

US 2024/0055038 A1    Feb. 15, 2024

Related U.S. Application Data

(63) Continuation of application No. PCT/CN2023/095137, filed on May 18, 2023.

(30) Foreign Application Priority Data

Aug. 10, 2022 (CN) .......................... 202210956408.0

(51) Int. Cl.
G11C 11/406 (2006.01)
G11C 11/4078 (2006.01)
G11C 11/408 (2006.01)
G11C 29/00 (2006.01)

(52) U.S. Cl.
CPC .... *G11C 11/40618* (2013.01); *G11C 11/4078* (2013.01); *G11C 11/4087* (2013.01); *G11C 29/785* (2013.01)

(58) Field of Classification Search
CPC .......... G11C 11/40618; G11C 11/4078; G11C 11/4087; G11C 29/785

USPC .......................................................... 365/222
See application file for complete search history.

(56) References Cited

U.S. PATENT DOCUMENTS

| 9,799,391 | B1 | 10/2017 | Wei | |
|---|---|---|---|---|
| 2024/0037230 | A1* | 2/2024 | Chen | ...................... G06F 21/554 |
| 2024/0160732 | A1* | 5/2024 | Park | ...................... G11C 11/4078 |

(Continued)

FOREIGN PATENT DOCUMENTS

| CN | 106782633 A | 5/2017 |
|---|---|---|
| CN | 108154895 A | 6/2018 |
| CN | 111164699 A | 5/2020 |

(Continued)

OTHER PUBLICATIONS

PCT International Search Report and the Written Opinion mailed Jun. 23, 2023, issued in related International Application No. PCT/CN2023/095137, with partial English machine translation (9 pages).

*Primary Examiner* — Connie C Yoha

(74) *Attorney, Agent, or Firm* — Sheppard Mullin Richter & Hampton LLP

(57) ABSTRACT

An address refresh check method includes: setting a row address with a highest repetition rate or with a quantity of repetition times exceeding a predetermined threshold as a seed address, and determining an address type; if the address type is a random address, obtaining an expected refresh address; performing a row hammer refresh operation to obtain an actual refresh address; and comparing the expected refresh address with the actual refresh address to obtain a check result.

13 Claims, 5 Drawing Sheets

(56) References Cited

U.S. PATENT DOCUMENTS

2025/0103217 A1* 3/2025 Kim ..................... G06F 3/0659

FOREIGN PATENT DOCUMENTS

| CN | 114121077 A | 3/2022 |
| CN | 114388025 A | 4/2022 |

* cited by examiner

ADDRESS REFRESH CHECK METHOD AND APPARATUS, STORAGE MEDIUM, AND ELECTRONIC DEVICE

CROSS-REFERENCE TO RELATED APPLICATIONS

This application is a continuation application of International Patent Application No. PCT/CN2023/095137, filed on May 18, 2023, which claims priority to Chinese Patent Application No. 202210956408.0, filed on Aug. 10, 2022, and entitled "ADDRESS REFRESH CHECK METHOD AND APPARATUS, STORAGE MEDIUM, AND ELECTRONIC DEVICE". The above-referenced applications are incorporated herein by reference in their entirety.

TECHNICAL FIELD

The present invention relates to the field of integrated circuit technologies, and in particular, to an address refresh check method, an address refresh check apparatus, a computer-readable storage medium, and an electronic device.

BACKGROUND

The addresses of integrated circuits may suffer from row hammer attacks. Such attacked addresses are generally referred to as row hammer rows, and adjacent addresses of row hammer rows are referred to as victim rows or row hammer damaged addresses. To prevent data error in the victim rows, a row hammer refresh circuit can be added to the integrated circuit to refresh the victim rows, thereby protecting the data. Verification of an address that is refreshed based on an enable signal by the row hammer refresh circuit is one of the effective methods for ensuring execution accuracy of the row hammer refresh circuit.

It should be noted that the information disclosed in the BACKGROUND section is used merely to enhance understanding of the background of the present invention, and therefore may include information that does not constitute prior art known to a person of ordinary skill in the art.

SUMMARY

The present invention provides an address refresh check method, an address refresh check apparatus, a computer-readable storage medium, and an electronic device, so as to provide a method for checking a row hammer refresh address.

According to a first aspect of the present invention, an address refresh check method is provided, including: monitoring row addresses used for data access, and setting a row address with a highest repetition rate or a row address with a quantity of repetition times exceeding a predetermined threshold as a seed address; and determining whether an address type of the detected seed address includes a random address or a fixed address; if the address type is the random address, obtaining an expected refresh address of a row hammer refresh operation based on the seed address and a conventional address decoding policy; performing the row hammer refresh operation to obtain an actual refresh address of the row hammer refresh operation; and comparing the expected refresh address with the actual refresh address to obtain a check result.

In some example implementations of the present invention, the method further includes: if the address type is the fixed address, determining whether a conventional address is replaced with a redundant address; if the conventional address is replaced with the redundant address, determining whether the fixed address is a logical address of the conventional address replaced with the redundant address; and if the fixed address is not a logical address of the conventional address replaced with the redundant address, obtaining the expected refresh address of the row hammer refresh operation based on the seed address and the conventional address decoding policy; or if the fixed address is a logical address of the conventional address replaced with the redundant address, obtaining the expected refresh address of the row hammer refresh operation based on the seed address and a redundant address decoding policy.

In some example implementations of the present invention, the method further includes: if no conventional address is replaced with the redundant address, determining whether a detection circuit configured to detect a row address or a receiving circuit configured to receive a row address is damaged.

In some example implementations of the present invention, the method further includes: if the conventional address is replaced with the redundant address, determining whether types of all redundant addresses for replacement include all types of redundant addresses, where the types of redundant addresses include a central valid address, an edge valid address, and an invalid address.

According to a second aspect of the present invention, an address refresh check apparatus is provided. The apparatus includes: an address detection module, configured to: monitor row addresses used for data access, and set a row address with a highest repetition rate or a row address with a quantity of repetition times exceeding a predetermined threshold as a seed address; and determine whether an address type of the detected seed address includes a random address or a fixed address; an expected refresh address determining module, configured to: if the address type is the random address, obtain an expected refresh address of a row hammer refresh operation based on the seed address and a conventional address decoding policy; an actual refresh address determining module, configured to perform the row hammer refresh operation to obtain an actual refresh address of the row hammer refresh operation; and a comparison module, configured to compare the expected refresh address with the actual refresh address to obtain a check result.

In some example implementations of the present invention, the expected refresh address determining module is further configured to: if the address type is the fixed address, determine whether a conventional address is replaced with a redundant address; if the conventional address is replaced with the redundant address, determine whether the fixed address is a logical address of the conventional address replaced with the redundant address; and if the fixed address is not a logical address of the conventional address replaced with the redundant address, obtain the expected refresh address of the row hammer refresh operation based on the seed address and the conventional address decoding policy; or if the fixed address is a logical address of the conventional address replaced with the redundant address, obtain the expected refresh address of the row hammer refresh operation based on the seed address and a redundant address decoding policy.

In some example implementations of the present invention, the apparatus further includes a unit detection module, configured to: if no conventional address is replaced with the redundant address, determine whether a detection circuit configured to detect a row address or a receiving circuit configured to receive a row address is damaged.

In some example implementations of the present invention, the apparatus further includes a type detection module, configured to: if the conventional address is replaced with the redundant address, determine whether types of all redundant addresses for replacement include all types of redundant addresses, where the types of redundant addresses include a central valid address, an edge valid address, and an invalid address.

According to a third aspect of the present invention, a computer-readable storage medium is provided. The computer-readable storage medium stores a computer program, and the computer program is executed by a processor to implement the above-mentioned address refresh check method.

According to a fourth aspect of the present invention, a memory device is provided, which is configured to perform the above-mentioned address refresh check method.

It should be understood that the previous general descriptions and the following detailed descriptions are merely examples and explanations and are not intended to limit the present invention.

BRIEF DESCRIPTION OF DRAWINGS

The accompanying drawings, which are incorporated in and form a part of this specification, illustrate some embodiments consistent with this application and, together with this specification, serve to explain the principles of the present invention. Clearly, the accompanying drawings in the following descriptions merely illustrate some embodiments of this application, and a person of ordinary skill in the art can derive other drawings from these accompanying drawings without creative efforts. In the drawings.

DESCRIPTION OF EMBODIMENTS

To make the objectives, features, and advantages of the present invention more comprehensible, the following further describes in detail the present invention with reference to the accompanying drawings and specific implementations.

An existing computer system generally uses a low-cost and high-density dynamic random access memory (DRAM) as a main memory of the system, which is also referred to as a memory. The DRAM uses charges in a capacitor to store data, but these charges are continuously lost with current leakage. Consequently, the DRAM can keep the data only for a short time. Therefore, the data in the capacitor needs to be read and rewritten periodically to compensate for the lost charges. Such an operation is referred to as refresh (Refresh). Refreshing can prevent data in a storage unit from being lost.

The DRAM generally includes a plurality of banks. Each bank is a two-dimensional storage array, where a horizontal direction is referred to as a row and a vertical direction is referred to as a column. In a refresh process, the DRAM selects one row (also referred to as a memory row) each time, and extracts all data of the row and places the data in a sense amplifier (also referred to as a row buffer). Such a process is referred to as an activation operation (Active). Then, reading and writing of the corresponding data are completed in the row buffer. The data in the row buffer is rewritten into a storage array, and such a process is referred to as a pre-charge operation (Pre-charge). An entire refresh process is implemented by performing an activation operation and a pre-charge operation.

However, as manufacturing precision of the DRAM is continuously improved, integration levels of components in the DRAM are continuously increasing. As a result, reading and writing of a memory unit in the DRAM may interfere with an adjacent memory unit, resulting in that a current flows into or flows out of the adjacent memory unit.

If the above-mentioned read/write process is repeatedly executed, it is equivalent to performing a row hammer (Row Hammer) attack on a memory unit. Consequently, content of an adjacent memory unit may be changed from 0 to 1 or from 1 to 0. Such a phenomenon is referred to as bit flipping.

A bit-flipping attack means that due to mutual impact of electrons between adjacent memory units, a data error occurs in a value of a specific unit after sufficient times of access. Such an attack is also referred to as a row hammer attack. An address suffering a row hammer attack is referred to as a row hammer damaged address.

Figure 1:
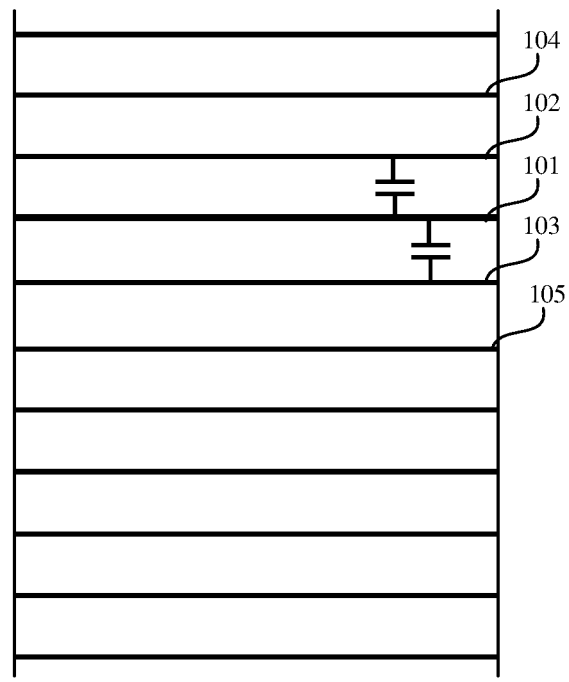
FIG. 1 is an example schematic diagram of a location of a hammer damaged address according to some example implementations of the present invention.

In some embodiments, the row hammer damaged address is usually an adjacent address of a row hammer address RH_RA that is frequently accessed. Referring to FIG. 1, a first address 101 is a row hammer address RH_RA that is frequently accessed. A second address 102 and a third address 103 are adjacent addresses immediately next to the first address 101, which are briefly referred to as near field addresses. A fourth address 104 and a fifth address 105 are adjacent addresses separated from the first address 101 by one address, which are briefly referred to as far field addresses. The second address 102, the third address 103, the fourth address 104, and the fifth address 105 can be referred to as row hammer damaged addresses that are affected by the first address 101 and may be subject to bit flipping. In this example, the row hammer damaged address includes a near field address immediately next to the row hammer address RH_RA, and a far field address that is separated from the row hammer address RH_RA by one address.

One chip generally includes a plurality of units. For example, one typical dynamic random access memory chip has up to 64 million storage units. In a process of manufacturing a typical dynamic random access memory chip, a million or even millions of units in a primary array may be defective, which are referred to as invalid addresses. To improve a yield rate of the chip, redundant lines are usually arranged on the chip. These redundant lines can substitute invalid lines on which defective invalid addresses are located, so that these defective invalid addresses are bypassed, and a storage circuit can be used normally.

Figure 2:
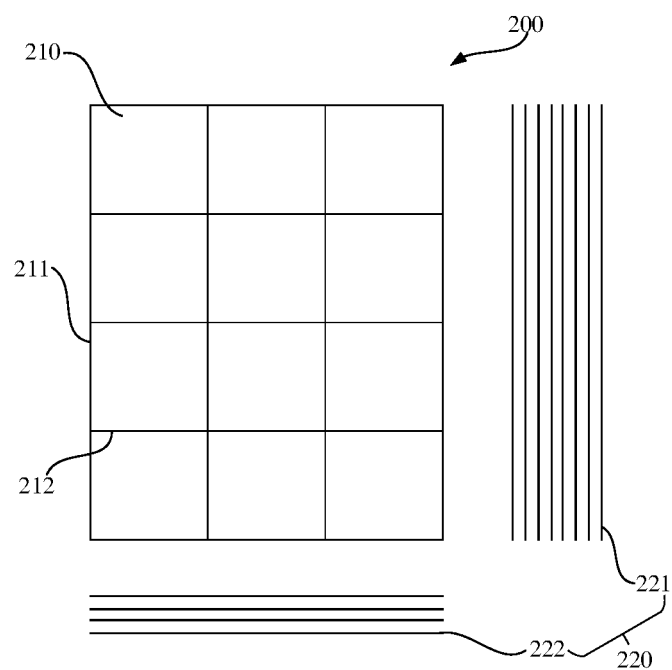
FIG. 2 is an example schematic structural diagram of a chip according to some example implementations of the present invention.

FIG. 2 is a schematic structural diagram of a chip according to some example implementations of the present invention. A chip 200 generally includes a normal storage unit area 210 and a redundant storage unit area 220, where the normal storage unit area 210 includes many storage units. The normal storage unit area 210 includes two types of orthogonal lines: a word line 212 and a bit line 211, where the bit line 211 is a column line, and the word line 212 is a row line. In addition to the normal storage unit area 210, the chip 200 further includes the redundant storage unit area 220 including a redundant storage unit. The redundant storage unit area 220 includes two types of orthogonal straight lines: a redundant word line 222 (Redundancy Word-Line, RWL) and a redundant bit line 221 (Redundancy Bit-Line, RBL). The redundant word line 222 is a row line and is configured to patch an invalid address on the word line 212. The redundant bit line 221 is a column line and is configured to patch an invalid address on the bit line 211.

Figure 3:
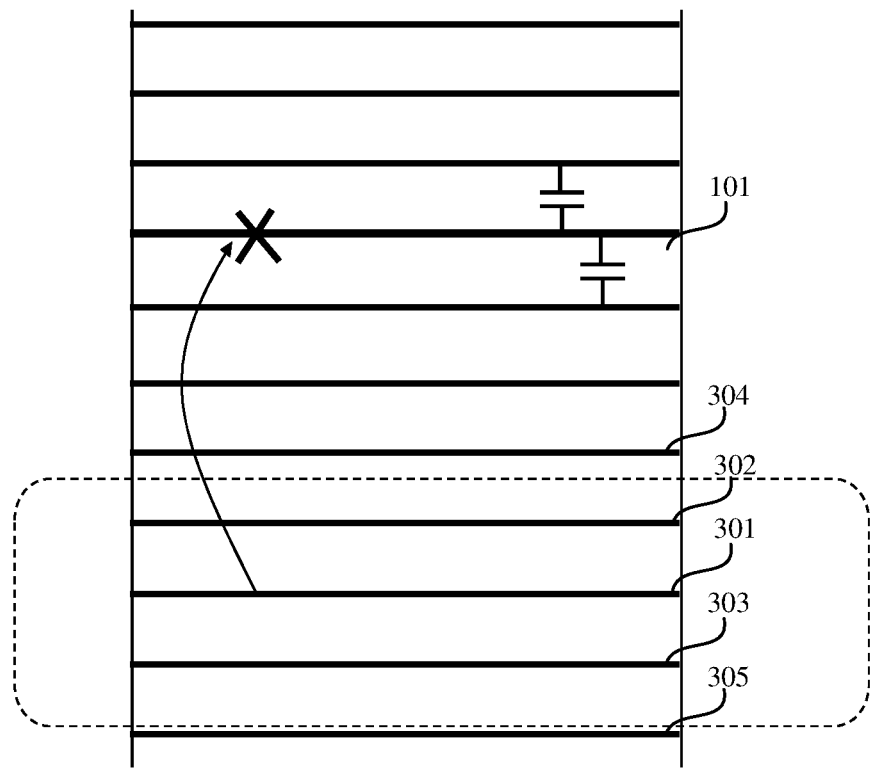
FIG. 3 is another example schematic diagram of a location of a hammer damaged address according to some example implementations of the present invention.

In some embodiments, as shown in FIG. 3, if the first address 101 in FIG. 1 is repaired by a sixth address 301, because the first address 101 is a row hammer address RH_RA that is frequently accessed, a seventh address 302, an eighth address 303, a ninth address 304, and a tenth address 305 that are adjacent to the sixth address 301 also become row hammer damaged addresses, where the sixth address 301, the seventh address 302, the eighth address 303, the ninth address 304, and the tenth address 305 are addresses corresponding to redundant storage units. In other words, an address for repairing a row hammer address becomes a new attack address, and an address adjacent to the new attack address also becomes a row hammer damaged address, and also may be subject to bit flipping.

It can be learned that a row hammer damaged address suffering a row hammer attack includes not only a storage unit address of a normal storage unit area, that is, a conventional address, but also a storage unit address of a redundant storage unit area, that is, a redundant address.

Therefore, in a process of performing RHR refresh protection on the row hammer damaged address by using the row hammer refresh circuit, the storage unit address of the normal storage unit area may be refreshed, or the storage unit address of the redundant storage unit area may be refreshed. RHR refresh is usually performed after common refresh is performed for a specific quantity of times. In other words, after performing common refresh for a specific quantity of times, the memory automatically performs RHR refresh once.

Based on this, some example implementations of the present invention provide an address refresh check method for storage unit address refresh check that is compatible with a normal storage unit area and a redundant storage unit area.

Although the following description focuses on DRAM devices, a person skilled in the art should understand that the present invention sought to be protected may be implemented to support any type of memory device that includes a plurality of units and that needs to be refreshed at a time interval or maintained otherwise to retain its content. A person skilled in the art should further understand that, although the following description focuses on a memory device whose storage units are organized based on a two-dimensional row-column array, the storage units may be organized using a plurality of methods, for example, be organized into a plurality of banks with or without interleaving, be organized into a two-dimensional or higher-dimensional array, be organized into a content addressable form, and so on. In addition, although at least a part of the following discussion focuses on a memory in a computer system, a person skilled in the art should understand that, the present invention sought to be protected may be implemented with reference to another electronic device or system having a memory device.

Figure 4:
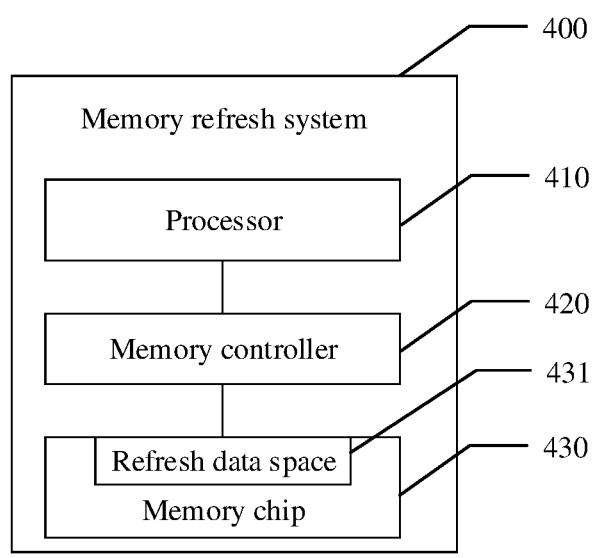
FIG. 4 is an example schematic networking diagram of a memory refresh system according to some example embodiments of the present invention.

FIG. 4 is a schematic networking diagram of a memory refresh system according to some embodiments of the present invention. As shown in FIG. 4, the memory refresh system 400 includes a processor 410, a memory controller 420, and a memory chip 430. The processor 410 reads and writes data in the memory chip 430 by using the memory controller 420.

During an actual operation, a refresh instruction may be directly sent by the memory controller 420 to the memory chip 430, and the memory chip 430 is controlled to perform a refresh operation. The refresh instruction includes a common refresh instruction and a row hammer refresh RHR instruction. A memory access instruction is sent by the processor 410 to the memory controller 420, and then sent by the memory controller 420 to the memory chip 430 for execution. The memory controller 420 controls a sequence of executing the refresh instruction and the memory access instruction. Generally, when performing a refresh operation, the memory controller 420 suspends sending a memory access instruction to the memory chip 430. The memory controller 420 sends the received memory access instruction to the memory chip 430 for performing a memory access operation, only after the refresh operation ends.

During specific implementation, the processor 410 and the memory controller 420 may be integrated into a same chip, or may be implemented by using two different chips, respectively. Generally, a storage space is predetermined in the memory chip 430 as a refresh data space 431. The refresh data space 431 may be one continuous region or may be a plurality of dispersed regions. An operating system cannot use these memory regions when allocating a memory to an application.

In some embodiments, the memory chip 430 may be implemented by using a DRAM chip. When the memory chip 430 is implemented by using a DRAM chip, the memory controller 420 may be implemented by using a DRAM controller.

In an actual process of executing a row hammer refresh RHR instruction, a row hammer refresh RHR circuit stores a row hammer address RH_RA that is frequently accessed in a period of time. For example, the row hammer address RH_RA is stored in the refresh data space 431 or in a predetermined register. The stored row hammer address RH_RA that is frequently accessed may be referred to as a seed address. The row hammer refresh RHR circuit determines, based on the seed address, a row hammer refresh address that needs to be refreshed, so as to perform the row hammer refresh.

According to the address refresh check method provided in some example implementations of the present invention, an actually refreshed address is checked to determine whether the address is an adjacent address of the row hammer address RH_RA, thereby verifying accuracy of the row hammer refresh.

Figure 5:
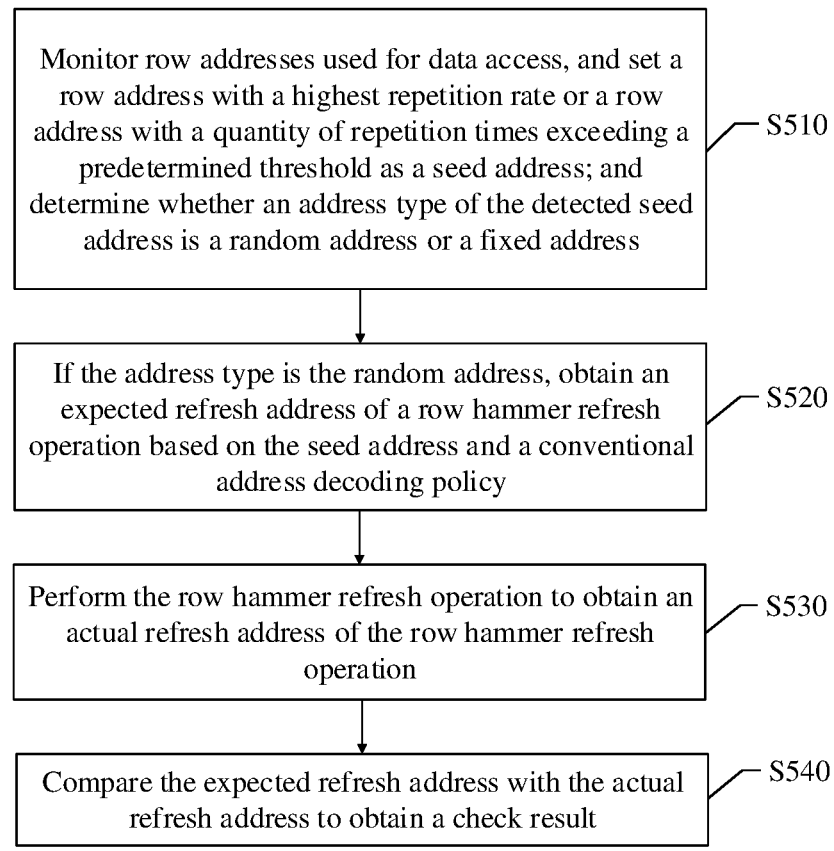
FIG. 5 is an example flowchart of steps of an address refresh check method according to some example embodiments of the present invention.

FIG. 5 is a flowchart of steps of an address refresh check method according to some embodiments of the present invention. In some feasible implementations, the above-mentioned address refresh check method may include:

Step S510: Monitor row addresses used for data access and set a row address with a highest repetition rate or a row address with a quantity of repetition times exceeding a predetermined threshold as a seed address; and determine whether an address type of the detected seed address includes a random address or a fixed address.

Step S520: If the address type is the random address, obtain an expected refresh address of a row hammer refresh operation based on the seed address and a conventional address decoding policy.

Step S530: Perform the row hammer refresh operation to obtain an actual refresh address of the row hammer refresh operation.

Step S540: Compare the expected refresh address with the actual refresh address to obtain a check result.

According to the address refresh check method provided in some embodiments of the present invention, the seed address in the data access process is determined by detecting the row addresses used for data access, and the expected refresh address of the row hammer refresh operation is obtained based on the seed address and the conventional address decoding policy when the address type of the detected row addresses is the random address; the row hammer refresh operation is performed to obtain the actual refresh address of the row hammer refresh operation; and then the expected refresh address is compared with the actual refresh address to obtain the check result. As such, the address refresh check method is provided to check the actual refresh address actually refreshed in the row hammer refresh process, so as to determine accuracy of the row hammer refresh process.

The following describes in detail the address refresh check method with reference to some specific implementations.

Step S510: Monitor row addresses used for data access and set a row address with a highest repetition rate or a row address with a quantity of repetition times exceeding a predetermined threshold as a seed address; and determine whether an address type of the detected seed address includes a random address or a fixed address.

In some example implementations of the present invention, after a system platform starts until loading of an operating system is completed, there exists an environment for accessing the memory. In such case, an access operation may be performed on a data address in the memory.

In some embodiments, accessing the data address in the memory means reading data (Read) from the memory, or writing data (Write) into the memory. Such a process is specifically implemented by sending a read command or a write command.

In some example implementations of the present invention, in a process of sending a read command or a write command to a storage unit to perform data access, row addresses used for data access need to be detected, so as to determine a seed address in the access process.

In some example implementations of the present invention, the seed address is a row address with a highest repetition rate or a row address with a quantity of repetition times exceeding a predetermined threshold. In some embodiments, a data address with a relatively large quantity of accesses in a period of time is determined as the seed address.

In some embodiments, the predetermined threshold may be determined according to an actual situation. For example, a data address that is highly frequently accessed in a period of time may be a data address that is accessed more than a few to ten thousand times within a refresh interval between two adjacent common refresh operations, and is equivalent to a data address that is accessed more than a few to ten thousand times within tens of milliseconds of an entire refresh cycle. In other words, the predetermined threshold may be a few to ten thousand times. The predetermined threshold is not specifically limited in some example implementations of the present invention.

In some example implementations of the present invention, the seed address is monitored in real time in a process of accessing a data address in the memory. The seed address is equivalent to a row hammer address in the process of accessing a data address. An address adjacent to the row hammer address becomes a row hammer damaged address and may be subject to bit flipping. Therefore, a row hammer refresh operation needs to be performed on a row hammer damaged address subsequently, and a row hammer damaged address may be re-read and rewritten by performing a row hammer refresh operation, thereby reducing the risk of subjecting a row hammer damaged address to bit flipping.

In some embodiments, the seed address may be consistently monitored throughout a process of accessing a data address in the memory. In some embodiments, the seed address may be monitored within a specified period of time. This is not specifically limited in some example implementations of the present invention.

It should be noted that, in the process of monitoring the seed address, the seed address needs to be monitored in real time in the time period of monitoring. For example, the seed address needs to be monitored in real time throughout the process of accessing a data address in the memory, or the seed address needs to be monitored in real time in a specified period of time. Real-time monitoring means monitoring each accessed data address. Finally, a data address highly frequently accessed in a period of time is counted as the seed address.

As described above, a chip 200 generally includes a normal storage unit area 210 and a redundant storage unit area 220. The normal storage unit area 210 includes a conventional address, and the redundant storage unit area 220 includes a redundant address. In some example implementations of the present invention, specific operations of address refresh check on a conventional address and a redundant address are different. The above-mentioned differences are first reflected in different methods for accessing a data address in the memory.

Specifically, if address refresh check is performed on a conventional address that is not replaced with a redundant address, a data address in the memory may be randomly accessed. Random means that an access time is unrelated to a physical location of a storage unit. Access means write and read operations. Random access (also referred to as direct access) represents that an arbitrary unit in a sequence of units is accessed at a same time.

In some embodiments, if address refresh check is performed on a redundant address that substitutes a conventional address, in a process of accessing a data address in the memory, a predetermined quantity of redundant addresses AddrRED may be first selected to substitute an original conventional address AddrACT. Then, the original conventional address AddrACT is repeatedly accessed. It should be noted that although the original conventional address AddrACT is repeatedly accessed, an adjacent address corresponding to the redundant address AddrRED is refreshed when the row hammer refresh is executed.

In some embodiments, the predetermined quantity may be set according to an actual situation. For example, the predetermined quantity of redundant addresses AddrRED may be tens of groups of redundant addresses AddrRED. The predetermined quantity is not specifically limited in some example implementations of the present invention.

In some example implementations of the present invention, different methods for accessing a data address in the memory may be reflected in the address type of the detected row addresses. Specifically, the address type may include a random address and a fixed address. The random address means the above-mentioned row address for performing random access, and the fixed address means the original conventional address that is repeatedly accessed.

Step S520: If the address type is the random address, obtain an expected refresh address of a row hammer refresh operation based on the seed address and a conventional address decoding policy.

In some example implementations of the present invention, if an address type of the detected seed address is a random address, it indicates that a data access process is a random access process. In such case, the expected refresh address of the row hammer refresh operation may be obtained directly based on the seed address and the conventional address decoding policy.

In some example implementations of the present invention, the conventional address decoding policy means mapping a logical address of the seed address to a physical address of the seed address, determining a physical address of a row hammer damaged address corresponding to the seed address based on the physical address of the seed address, and then mapping the physical address of the row hammer damaged address to a corresponding logical address of the row hammer damaged address, so as to serve as the expected refresh address of the row hammer refresh operation. In some embodiments, the logical address of the row hammer damaged address may be determined directly based on the logical address of the seed address.

In some embodiments, in the process of determining the physical address of the row hammer damaged address corresponding to the seed address based on the physical address of the seed address, because the address type of the above-mentioned seed address is a random address, it indicates that the above-mentioned seed address is a conventional address. In such case, an addition and/or subtraction operations ($\pm 1$ or $\pm 2$) may be performed on the seed address corresponding to the conventional address, and the obtained address is the physical address of the row hammer damaged address. As shown in FIG. 1, the second address 102 and the third address 103 may be obtained by performing the $\pm 1$ operation on the first address 101. The fourth address 104 and the fifth address 105 may be obtained by performing the $\pm 2$ operation on the first address 101. The second address 102, the third address 103, the fourth address 104, and the fifth address 105 that are obtained above are all physical addresses of predicted row hammer damaged addresses for performing the row hammer refresh operation.

The physical address is an actual address in the memory, which is also referred to as an absolute address. The logical address is an address in an access instruction and is a relative address. Generally, a conventional address and a redundant address may have the same logical address, but different physical addresses. When a conventional address is damaged and is replaced with a redundant address, a logical address of the redundant address is the same as a logical address of the replaced conventional address.

In some example implementations of the present invention, if the determined address type of the seed address is a fixed address, it is necessary to first determine whether a conventional address is replaced with a redundant address, that is, to determine whether the fixed address is the above-mentioned original conventional address AddrACT. In some embodiments, there may be a case in which a memory access instruction is incorrectly sent, that is, a case in which no conventional address in the storage unit is replaced with a redundant address, and the memory access instruction sends repeated access to a specific conventional address.

If the address type is a fixed address, but no conventional address is replaced with a redundant address, it may be determined whether a detection circuit configured to detect a row address or a receiving circuit configured to receive a row address is damaged. If the detection circuit or the receiving circuit is damaged, there exists a case in which the random address is determined as the fixed address. In such case, the damaged detection circuit or the damaged receiving circuit needs to be replaced or repaired.

However, if neither the detection circuit nor the receiving circuit is damaged, it is possible that the memory access instruction is incorrectly sent. In such case, the memory access instruction may be checked. If the memory access instruction is incorrect, the memory access instruction may be resent to perform address refresh check.

In some example implementations of the present invention, if it is determined that the conventional address is replaced with the redundant address, it is necessary to further determine whether the fixed address is a logical address of the conventional address that is replaced with the redundant address, that is, determine whether the fixed address is the above-mentioned original conventional address AddrACT that is replaced with the redundant address AddrRED.

If the fixed address is not a logical address of the conventional address that is replaced with the redundant address, it indicates that the fixed address is the conventional address, and the expected refresh address of the row hammer refresh operation may be obtained based on the above-mentioned seed address and the conventional address decoding policy. Details are not described herein again.

If the fixed address is the logical address of the conventional address that is replaced with the redundant address, the expected refresh address of the row hammer refresh operation may be obtained based on the seed address and the redundant address decoding policy. The redundant address decoding policy means mapping a logical address of the redundant address to a physical address of the redundant address, determining a physical address of a row hammer damaged address corresponding to the redundant address based on the physical address of the redundant address, and then mapping the physical address of the row hammer damaged address to a corresponding logical address of the row hammer damaged address, so as to serve as the expected refresh address of the row hammer refresh operation.

In some embodiments, in the process of determining the physical address of the row hammer damaged address corresponding to the redundant address based on the physical address of the redundant address, the address obtained by performing an addition and/or subtraction operations ($\pm 1$ or $\pm 2$) on the physical address of the redundant address may be determined as the expected refresh address. As shown in FIG. 3, if the first address 101 in FIG. 1 is repaired by the sixth address 301, the first address 101 is the original conventional address AddrACT, and the sixth address 301 is the redundant address AddrRED. Adjacent seventh address 302 and eighth address 303 may be obtained by performing the ±1 operation on the sixth address 301. Adjacent ninth address 304 and tenth address 305 may be obtained by performing the ±2 operation on the sixth address 301. The sixth address 301, the seventh address 302, the eighth address 303, the ninth address 304, and the tenth address 305 that are obtained above are all physical addresses of predicted row hammer damaged addresses for performing the row hammer refresh operation.

It should be further noted that, in some example implementations of the present invention, if it is determined that a conventional address is replaced with a redundant address, it may be determined whether types of all redundant addresses for replacement include all types of redundant addresses. If the types of all redundant addresses for replacement include all types of redundant addresses, it indicates that the redundant addresses for performing address refresh check cover a relatively complete range and may be used to check all types of redundant addresses.

In some embodiments, the types of redundant addresses include a central valid address, an edge valid address, and an invalid address. It should be noted that, even if the redundant address is an invalid address and cannot be actually used as an address, the redundant address can still be used to substitute a conventional address. However, the present invention is intended to detect whether the redundant address successfully substitutes the conventional address, regardless of whether the redundant address can be actually used as an address.

Step S530: Perform the row hammer refresh operation to obtain an actual refresh address of the row hammer refresh operation.

In some embodiments, the row hammer refresh operation RHR is usually inserted among common refresh operations for execution, that is, the row hammer refresh operation RHR is performed after the common refresh operation is performed for a predetermined time. The common refresh operation means periodically reading and rewriting data in all data addresses in the memory, so as to compensate for lost charges and prevent the data in the storage unit from being lost. The row hammer refresh operation RHR means performing a refresh operation on a row hammer damaged address to prevent data in the row hammer damaged address from being subject to bit flipping.

In some embodiments, specifically, in the process of performing the row hammer refresh operation RHR, an RHR command may be used to substitute a received refresh command, to steal the refresh command and perform the row hammer refresh operation RHR. After execution of the row hammer refresh operation RHR is completed, the refresh command is executed. The refresh command herein is a command for performing the common refresh operation.

In some embodiments, due to reasons such as a circuit error, in the process of performing the row hammer refresh operation, the refreshed row hammer refresh address is not necessarily the row hammer damaged address, i.e., is not necessarily the above-mentioned expected refresh address.

Figure 6:
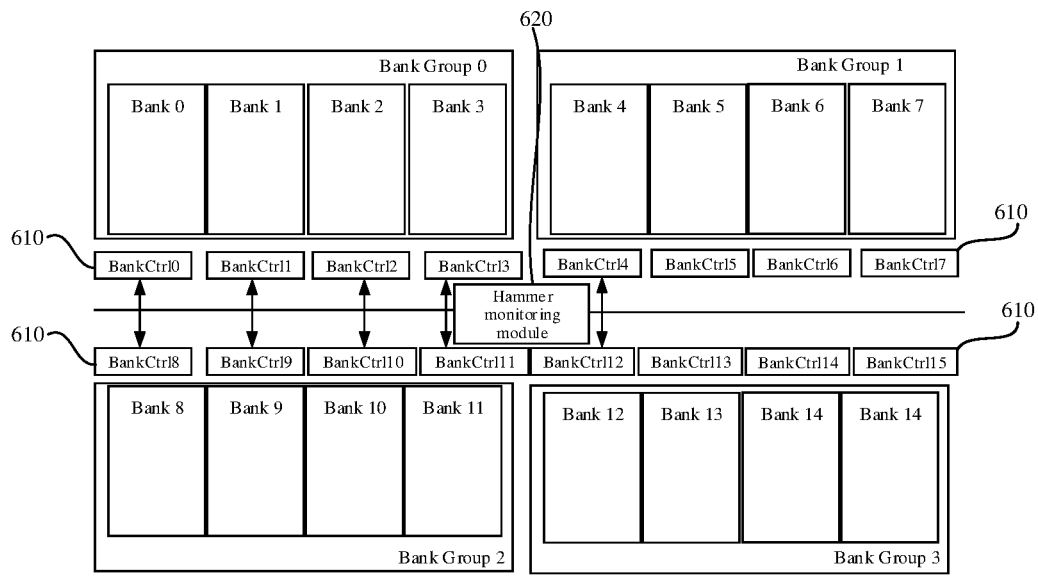
FIG. 6 is an example schematic structural diagram of an internal array of a dynamic random access memory (DRAM) according to some example embodiments of the present invention.

Therefore, in some example implementations of the present invention, after execution of the row hammer refresh operation is completed, the actual refresh address for actually performing the row hammer refresh operation may be obtained by using a hammer monitoring circuit 620 shown in FIG. 6. Specifically, the hammer monitoring circuit 620 may be configured to monitor and record, in real time, a data address for performing a refresh operation in an array, so as to determine the actual refresh address that the row hammer refresh operation actually performed on.

FIG. 6 is a schematic structural diagram of an internal array of a dynamic random access memory (DRAM) according to some example implementations of the present invention. In FIG. 6, there are a total of 16 arrays in the DRAM, which are represented by BANK0 to BANK15, respectively. The four arrays BANK0 to BANK3 form a first bank group (that is, Bank Group 0). The four arrays BANK4 to BANK7 form a second bank group (that is, Bank Group 1). The four arrays BANK8 to BANK11 form a third bank group (that is, Bank Group 2). The four arrays BANK12 to BANK15 form a fourth bank group (that is, Bank Group 3).

16 array control circuits 610 are disposed on external circuits of the above-mentioned four bank groups: the first bank group, the second bank group, the third bank group, and the fourth bank group. One hammer monitoring circuit 620 is correspondingly disposed in each array control circuit 610. In the figure, BankCtrl0 to BankCtrl15 represent 16 array control circuits 610. BankCtrl0 is connected to BANK0 and is configured to control BANK0. BankCtrl1 is connected to BANK1 and is configured to control BANK1. By analogy, BankCtrl15 is connected to BANK15 and is configured to control BANK15. There are a total of 16 hammer monitoring circuits 620 in FIG. 6. The hammer monitoring circuit 620 is configured to provide a hammer protection enable signal for the array control circuit 610, and the hammer protection enable signal is configured to control the array control circuit to refresh the row hammer damaged address or stop accessing the seed address and the row hammer damaged address. The 16 hammer monitoring circuits 620 are disposed on a bus outside the array and are configured to monitor an actual refresh address in each memory array.

Step S540: Compare the expected refresh address with the actual refresh address to obtain a check result.

In some example implementations of the present invention, after the actual refresh address and the expected refresh address are determined, the actual refresh address may be compared with the expected refresh address. If the actual refresh address is consistent with the expected refresh address, it is determined that the address refresh check succeeds. If the actual refresh address is inconsistent with the expected refresh address, it is determined that the address refresh check fails.

Figure 7:
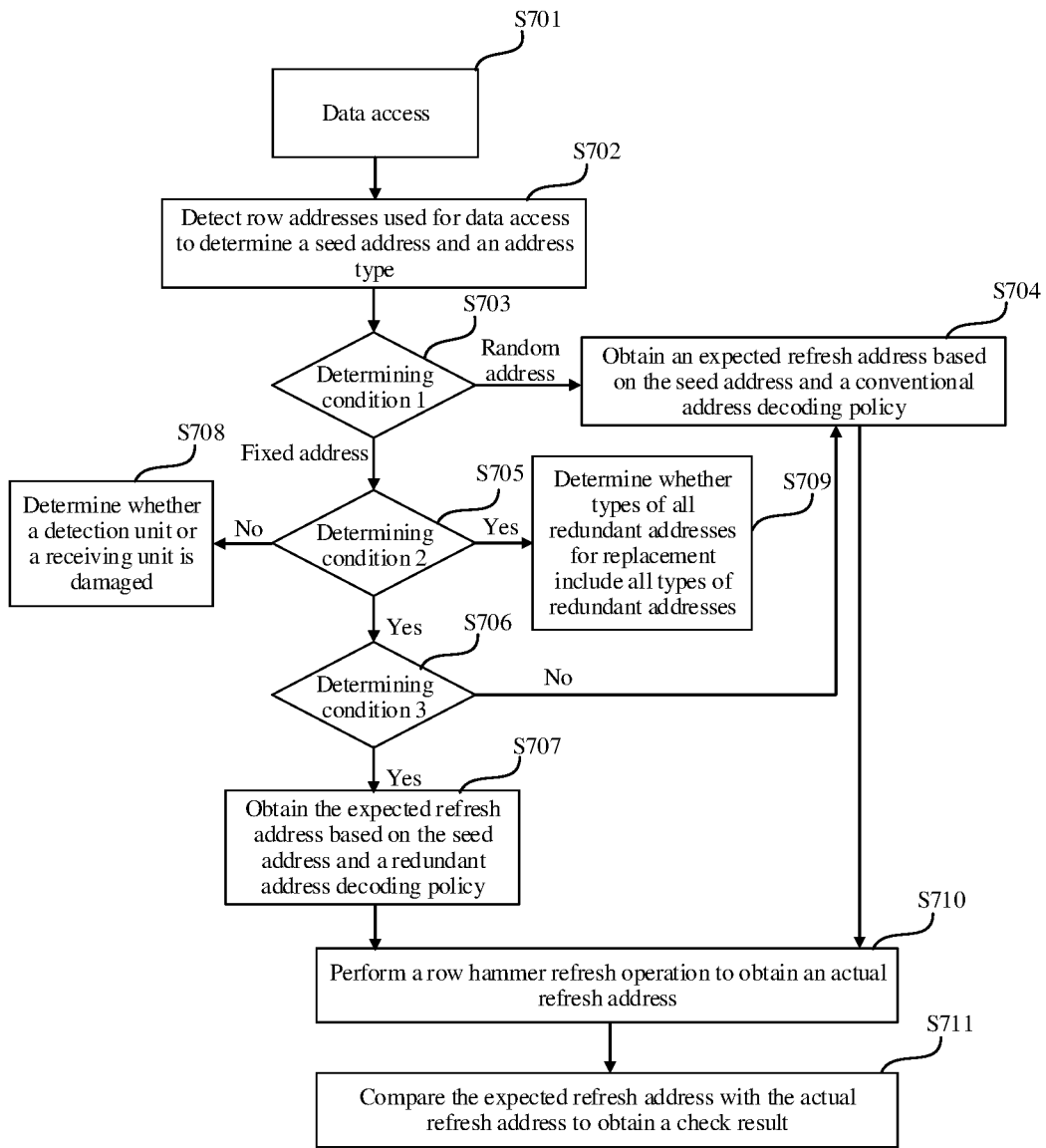
FIG. 7 is an example flowchart of operation steps of an address refresh check method according to some example embodiments of the present invention.

FIG. 7 is a flowchart of operation steps of an address refresh check method according to some example implementations of the present invention. As shown in FIG. 7, step S701 is first performed, that is, a data access instruction is sent for data access. Then, step S702 is performed, that is, row addresses used for data access are detected to determine a seed address and an address type. Next, step S703 is performed, that is, a determining condition 1 is executed to determine an address type. If the address type is a random address, step S704 is performed, that is, the expected refresh address is obtained based on the seed address and the conventional address decoding policy. If the address type is a fixed address, step S705 is performed, that is, a determining condition 2 is executed to determine whether a conventional address is replaced with a redundant address. If the conventional address is replaced with the redundant address, step S706 is performed, that is, a determining condition 3 is executed to determine whether the fixed address is a logical address of the conventional address that is replaced with the redundant address. If the fixed address is not a logical address of the conventional address that is replaced with the redundant address, step S704 is performed. If the fixed address is a logical address of the conventional address that is replaced with the redundant address, step S707 is performed, that is, the expected refresh address is obtained based on the seed address and the redundant address decoding policy. Then, as shown in FIG. 7, the determining condition 2 is further executed. If no conventional address is replaced with the redundant address, step S708 is performed to determine whether a detection circuit or a receiving circuit is damaged. If a conventional address is replaced with the redundant address, not only step S706 is performed, but also step S709 is performed to determine whether types of all redundant addresses for replacement include all types of redundant addresses.

Then, as shown in FIG. 7, step S704 and step S707 are performed. After the expected refresh address is obtained, step S710 may be performed, that is, a row hammer refresh operation is performed to obtain an actual refresh address. Next, step S711 is performed, that is, the expected refresh address is compared with the actual refresh address to obtain a check result.

It should be noted that, obtaining the expected refresh address and performing the row hammer refresh operation may be performed at the same time or in sequence. In addition, a sequence of performing the two steps is not specifically limited in some example implementations of the present invention.

In summary, according to the address refresh check method provided in some example implementations of the present invention, different check processes are performed for performing row hammer refresh address RHR check on the conventional address and performing row hammer refresh address RHR check on the redundant address. An address refresh check method compatible with the conventional address and the redundant address is provided, thereby implementing automatic check of all addresses in the row hammer refresh address RHR check process, reducing complex manual check work, and improving accuracy and efficiency of verification.

It should be noted that the above-mentioned address refresh check method may be implemented on a simulation platform, such as a Verilog simulation platform. A specific implementation process is not described herein again.

It should be noted that, although the steps of the method in the present invention are described in the accompanying drawings in a particular sequence, it does not require or imply that these steps necessarily be performed in that particular sequence, or that all steps shown necessarily be performed to achieve a desired result. Additionally or alternatively, some steps may be omitted, a plurality of steps may be combined into one step for execution, and/or a step may be broken down into a plurality of steps for execution, or the like.

Figure 8:
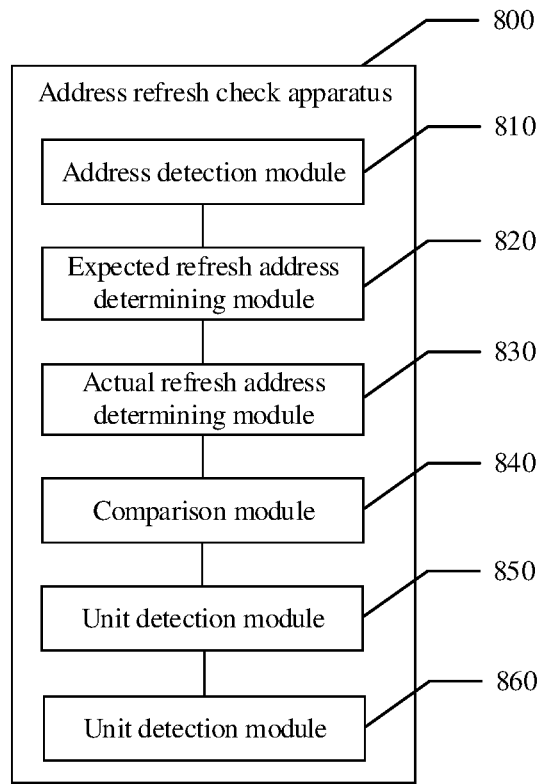
FIG. 8 is an example block diagram of an address refresh check apparatus according to some example embodiments of the present invention.

In addition, some example embodiments further provide an address refresh check apparatus. Referring to FIG. 8, the address refresh check apparatus 800 may include an address detection module 810, an expected refresh address determining module 820, an actual refresh address determining module 830, a comparison module 840, a unit detection module 850, and a type detection module 860.

The address detection module 810 may be configured to: monitor row addresses used for data access, and set a row address with a highest repetition rate or a row address with a quantity of repetition times exceeding a predetermined threshold as a seed address; and determine whether an address type of the detected seed address includes a random address or a fixed address.

The expected refresh address determining module 820 may be configured to: if the address type is the random address, obtain an expected refresh address of a row hammer refresh operation based on the seed address and a conventional address decoding policy.

The actual refresh address determining module 830 may be configured to perform the row hammer refresh operation to obtain an actual refresh address of the row hammer refresh operation.

The comparison module 840 may be configured to compare the expected refresh address with the actual refresh address to obtain a check result.

In some example implementations of the present invention, the expected refresh address determining module 820 may be further configured to: if the address type is the fixed address, determine whether a conventional address is replaced with a redundant address; if the conventional address is replaced with the redundant address, determine whether the fixed address is a logical address of the conventional address replaced with the redundant address; and if the fixed address is not a logical address of the conventional address replaced with the redundant address, obtain the expected refresh address of the row hammer refresh operation based on the seed address and the conventional address decoding policy; or if the fixed address is a logical address of the conventional address replaced with the redundant address, obtain the expected refresh address of the row hammer refresh operation based on the seed address and a redundant address decoding policy.

In some example implementations of the present invention, the apparatus further includes a unit detection module 850, which may be configured to: if no conventional address is replaced with the redundant address, determine whether a detection circuit configured to detect a row address or a receiving circuit configured to receive a row address is damaged.

In some example implementations of the present invention, the apparatus further includes a type detection module 860, which may be configured to: if the conventional address is replaced with the redundant address, determine whether types of all redundant addresses for replacement include all types of redundant addresses, where the types of redundant addresses include a central valid address, an edge valid address, and an invalid address.

Specific details of the virtual modules on the apparatus sides have been described in detail on corresponding method sides. Therefore, details are not described herein again.

It should be noted that although some modules or units on the apparatus side are mentioned in the previous detailed description, such division is not mandatory. In fact, according to some implementations of the present invention, the features and functions of the two or more modules or units described above may be embodied in one module or unit. On the contrary, a feature and a function of one module or unit described above may be further divided into a plurality of modules or units for specific implementation.

Some example embodiments of the present invention further provide an electronic device capable of implementing the above-mentioned method.

A person skilled in the art should understand that aspects of the present invention may be implemented as systems, methods, or program products. Therefore, the aspects of the present invention may be specifically implemented in the following forms, that is, a hardware-only implementation, a software-only implementation (including firmware, microcode, and the like), or an implementation in which hardware and software aspects are combined, which may be collectively referred to as a "circuit", "module", or "system".

Figure 9:
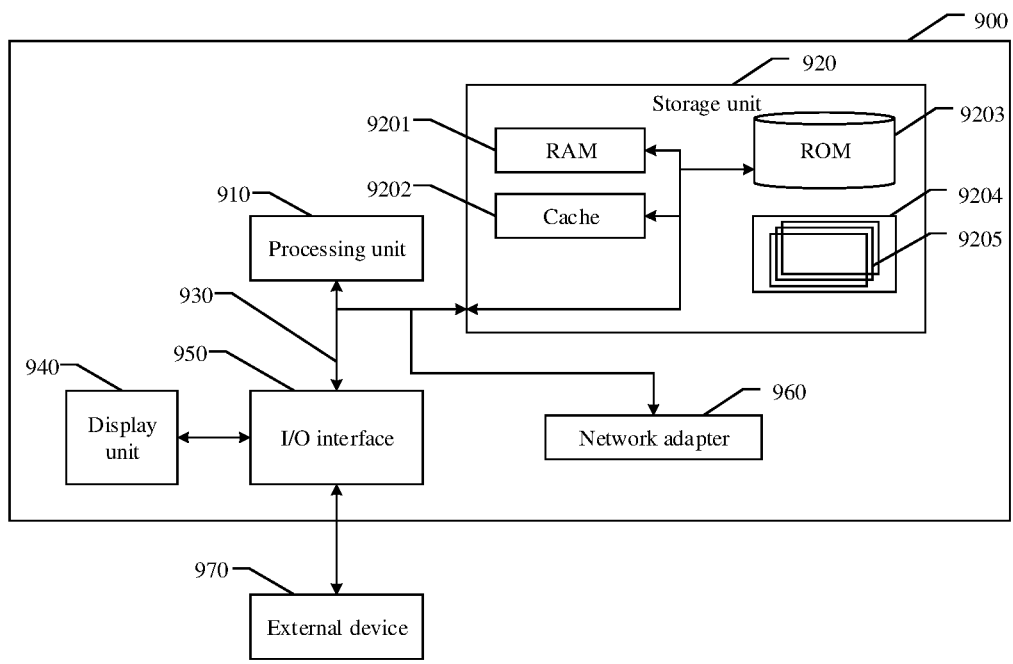
FIG. 9 is an example schematic diagram of modules of an electronic device according to some example embodiments of the present invention.

The following describes an electronic device 900 according to some implementations of the present invention with reference to FIG. 9. The electronic device 900 shown in FIG. 9 is merely an example and should not impose any limitation on a function and an application scope of some embodiments of the present invention.

As shown in FIG. 9, the electronic device 900 is represented as a general-purpose computing device. Components of the electronic device 900 may include but are not limited to at least one processing unit 910, at least one storage unit 920, a bus 930 connecting different system components (including the storage unit 920 and the processing unit 910), and a display unit 940.

The storage unit 920 stores program code and the program code may be executed by the processing unit 910, so that the processing unit 910 performs the steps described in the above-mentioned "example method" part in this specification according to the example implementations of the present invention. For example, the processing unit 910 may perform the following steps shown in FIG. 5: Step S510: Monitor row addresses used for data access, and set a row address with a highest repetition rate or a row address with a quantity of repetition times exceeding a predetermined threshold as a seed address; and determine whether an address type of the detected seed address includes a random address or a fixed address. Step S520: If the address type is the random address, obtain an expected refresh address of a row hammer refresh operation based on the seed address and a conventional address decoding policy. Step S530: Perform the row hammer refresh operation to obtain an actual refresh address of the row hammer refresh operation. Step S540: Compare the expected refresh address with the actual refresh address to obtain a check result.

The storage unit 920 may include a readable medium in a form of a volatile storage unit, such as a random access memory (RAM) unit 9201 and/or a cache memory unit 9202, and may further include a read-only memory (ROM) unit 9203.

The storage unit 920 may also include a program/utility 9204 with a set (at least one) of program modules 9205. Such program modules 9205 include but are not limited to an operating system, one or more applications, another program module, and program data. Each or a combination of these examples may include an implementation of a network environment.

The bus 930 may be one or more of several types of bus structures, including a storage unit bus or a storage unit controller, a peripheral bus, a graphics acceleration port, a processing unit, or a local bus using any one of various bus structures.

The electronic device 900 may also communicate with one or more external devices 970 (for example, a keyboard, a pointing device, and a Bluetooth device), with one or more devices that enable a user to interact with the electronic device 900, and/or with any device (for example, a router or a modem) that enables the electronic device 900 to communicate with one or more other computing devices. Such communication may be performed through an input/output (I/O) interface 950. In addition, the electronic device 900 may communicate with one or more networks (such as a local area network (LAN), a wide area network (WAN), and/or a public network such as the Internet) by using a network adapter 960. As shown in the figure, the network adapter 960 communicates with other modules of the electronic device 900 through the bus 930. It should be understood that, although not shown in the figures, other hardware and/or software modules may be used in combination with the electronic device 900, including but not limited to microcode, a device drive, a redundancy processing unit, an external disk drive array, a RAID system, a tape drive, a data backup storage system, and the like.

Based on the previous descriptions of some implementations, a person skilled in the art readily understands that, the example implementations described herein may be implemented by software, or may be implemented by software in combination with necessary hardware. Therefore, the technical solutions according to the implementations of the present invention may be implemented in a form of a software product. The software product may be stored in a non-volatile storage medium (which may be a CD-ROM, a USB flash drive, a removable hard disk, or the like) or on a network, and includes some instructions for enabling a computing device (which may be a personal computer, a server, a terminal apparatus, a network device, or the like) to perform the methods according to the implementations of the present invention.

Some example embodiments of the present invention further provide a computer-readable storage medium, which stores a program product that can implement the above-mentioned method in this specification. In some possible implementations, aspects of the present invention may be implemented in a form of a program product, and the program product includes program code. When the program product runs on a terminal device, the program code is used to enable the terminal device to perform the steps described in the above-mentioned "example method" part in this specification according to the example implementations of the present invention.

The program product used to implement the above-mentioned methods according to some implementations of the present invention may use a portable compact disc read-only memory (CD-ROM) and include program code, and may run on a terminal device such as a personal computer. However, the program product in the present invention is not limited thereto. In this specification, the readable storage medium may be any tangible medium that includes or stores a program, and the program may be used by an instruction execution system, apparatus, or device, or be used in combination with an instruction execution system, apparatus, or device.

The program product may use any combination of one or more readable media. The readable medium may be a readable signal medium or a readable storage medium. For example, the readable storage medium may be but is not limited to an electrical, magnetic, optical, electromagnetic, infrared, or semiconductor system, apparatus or device, or any combination thereof. A more specific example (non-exhaustive list) of the readable storage medium includes an electrical connection with one or more leads, a portable disk, a hard disk, a random access memory (RAM), a read-only memory (ROM), an erasable programmable read-only memory (EPROM or flash memory), an optical fiber, a portable compact disc read-only memory (CD-ROM), an optical storage device, a magnetic storage device, or any suitable combination thereof.

The computer-readable signal medium may include a data signal that is propagated in a baseband or as a part of a carrier, and carries readable program code. Such a propagated data signal may take a variety of forms, including but not limited to an electromagnetic signal, an optical signal, or any suitable combination thereof. The readable signal medium may also be any readable medium other than the readable storage medium. The readable medium may send, propagate, or transmit a program for use by or in combination with an instruction execution system, apparatus, or device.

The program code included in the readable medium may be transmitted in any suitable medium, including but not limited to a wireless medium, a wired medium, an optical cable, RF, or the like, or any suitable combination thereof.

Program code for performing the operations in the present invention may be written in one of or any combination of a plurality of programming languages. The programming languages include an object-oriented programming language, such as Java and C++, and also include a conventional procedural programming language, such as a "C" language or a similar programming language. The program code may be executed entirely on a user computing device, partly on a user computing device, as a separate software package, partly on a user computing device and partly on a remote computing device, or entirely on a remote computing device or server. In a case including a remote computing device, the remote computing device may be connected to a user computing device through any type of network, including a local area network (LAN) or a wide area network (WAN). In some embodiments, the remote computing device may be connected to an external computing device (for example, by using an Internet service provider for connection over the Internet).

In addition, the above-mentioned accompanying drawings are merely example descriptions of the processing operations included in the method according to some example embodiments of the present invention but are not intended to impose a limitation. It is easy to understand that the processing operations shown in the above-mentioned accompanying drawings do not indicate or restrict a time sequence of these processing operations. In addition, it is also easy to understand that these processing operations may be performed synchronously or asynchronously, for example, in a plurality of modules.

After considering the specification and practicing the invention disclosed herein, a person skilled in the art easily figures out other embodiments of the present invention. This application is intended to cover any variations, functions, or adaptive changes of the present invention. These variations, functions, or adaptive changes comply with general principles of the present invention, and include common knowledge or a commonly used technical means in the technical field that is not disclosed in the present invention. This specification and some embodiments are merely considered as examples, and the actual scope and the spirit of the present invention are pointed out by the claims.

It should be understood that the present invention is not limited to the precise structures that have been described above and shown in the accompanying drawings, and various modifications and changes can be made without departing from the scope of the present invention. The scope of the present invention is defined only by the appended claims.

What is claimed is:

1. An address refresh check method, wherein the method comprises:
   monitoring row addresses used for data access, and setting a row address with a highest repetition rate or a row address with a quantity of repetition times exceeding a predetermined threshold as a seed address;
   determining whether an address type of the seed address is a random address or a fixed address;
   in response to determining that the address type of the seed address is the random address, obtaining an expected refresh address of a row hammer refresh operation based on the seed address and a conventional address decoding policy;
   performing the row hammer refresh operation to obtain an actual refresh address of the row hammer refresh operation; and
   comparing the expected refresh address with the actual refresh address to obtain a check result.

2. The method according to claim 1, further comprising:
   in response to determining that the address type of the seed address is the fixed address, determining whether a conventional address is replaced with a redundant address;
   if the conventional address is replaced with the redundant address, determining whether the fixed address is a logical address of the conventional address replaced with the redundant address; and
   if the fixed address is not a logical address of the conventional address replaced with the redundant address, obtaining the expected refresh address of the row hammer refresh operation based on the seed address and the conventional address decoding policy; or if the fixed address is a logical address of the conventional address replaced with the redundant address, obtaining the expected refresh address of the row hammer refresh operation based on the seed address and a redundant address decoding policy.

3. The method according to claim 2, further comprising:
   if no conventional address is replaced with the redundant address, determining whether a detection circuit configured to detect a row address or a receiving circuit configured to receive a row address is damaged.

4. The method according to claim 2, further comprising:
   if the conventional address is replaced with the redundant address, determining whether types of all redundant addresses for replacement comprise all types of redundant addresses, wherein the types of redundant addresses comprise a central valid address, an edge valid address, and an invalid address.

5. The method according to claim 3, further comprising:
   if the conventional address is replaced with the redundant address, determining whether types of all redundant addresses for replacement comprise all types of redundant addresses, wherein the types of redundant addresses comprise a central valid address, an edge valid address, and an invalid address.

6. The method according to claim 1, wherein the method is implemented for a DRAM.

7. The method according to claim 1, wherein the method is simulated in a Verilog simulation platform.

8. A memory device configured to perform operations comprising:
   monitoring row addresses used for data access, and setting a row address with a highest repetition rate or a row address with a quantity of repetition times exceeding a predetermined threshold as a seed address;
   determining whether an address type of the seed address is a random address or a fixed address;
   in response to determining that the address type of the seed address is the random address, obtaining an expected refresh address of a row hammer refresh operation based on the seed address and a conventional address decoding policy;
   performing the row hammer refresh operation to obtain an actual refresh address of the row hammer refresh operation; and comparing the expected refresh address with the actual refresh address to obtain a check result.

9. The memory device according to claim 8, wherein the operations further comprise:
in response to determining that the address type of the seed address is the fixed address, determining whether a conventional address is replaced with a redundant address;
if the conventional address is replaced with the redundant address, determining whether the fixed address is a logical address of the conventional address replaced with the redundant address; and
if the fixed address is not a logical address of the conventional address replaced with the redundant address, obtaining the expected refresh address of the row hammer refresh operation based on the seed address and the conventional address decoding policy; or if the fixed address is a logical address of the conventional address replaced with the redundant address, obtaining the expected refresh address of the row hammer refresh operation based on the seed address and a redundant address decoding policy.

10. The memory device according to claim 9, wherein the operations further comprise:
if no conventional address is replaced with the redundant address, determining whether a detection circuit configured to detect a row address or a receiving circuit configured to receive a row address is damaged.

11. The memory device according to claim 9, wherein the operations further comprise:
if the conventional address is replaced with the redundant address, determining whether types of all redundant addresses for replacement comprise all types of redundant addresses, wherein the types of redundant addresses comprise a central valid address, an edge valid address, and an invalid address.

12. The memory device according to claim 10, wherein the operations further comprise:
if the conventional address is replaced with the redundant address, determining whether types of all redundant addresses for replacement comprise all types of redundant addresses, wherein the types of redundant addresses comprise a central valid address, an edge valid address, and an invalid address.

13. The memory device according to claim 8, wherein the operations are simulated in a Verilog simulation platform.

* * * * *